United States Patent [19]

Hasegawa

[11] Patent Number: 5,320,894
[45] Date of Patent: Jun. 14, 1994

[54] MULTILAYER INTERCONNECTION SUBSTRATE

[75] Inventor: Shinichi Hasegawa, Tokyo, Japan

[73] Assignee: NEC Corporation, Tokyo, Japan

[21] Appl. No.: 702,326

[22] Filed: May 20, 1991

[30] Foreign Application Priority Data

May 18, 1990 [JP] Japan ................................. 2-129563

[51] Int. Cl.$^5$ .............................................. B32B 9/00
[52] U.S. Cl. .................................... 428/137; 428/209;
428/210; 428/688; 428/901; 361/794; 174/250
[58] Field of Search ............... 428/688, 210, 209, 137,
428/901; 361/414; 174/250

[56] References Cited

U.S. PATENT DOCUMENTS

| | | | |
|---|---|---|---|
| 4,795,670 | 1/1989 | Nishigaki et al. | 428/210 |
| 4,954,480 | 9/1990 | Imanaka et al. | 428/688 |
| 5,082,718 | 1/1992 | Chantraine et al. | 428/209 |

FOREIGN PATENT DOCUMENTS

| | | |
|---|---|---|
| 0382203 | 8/1990 | European Pat. Off. |
| 2225670 | 6/1990 | United Kingdom |

OTHER PUBLICATIONS

European Search Report for Application EP 91 30 4397 and Annex thereto.
IEEE/ISHM, 90, 8th IEMT, May 7-9, 1990, CH28333-2/90/0000-0073, pp. 73-81, M. L. Zorilla et al., "New Technologies to Improve Density on Multi-chip Modules".
Patent Abstracts of Japan, vol. 10, No. 224 (E-425)(2280) Aug. 5, 1986 & JP-A-61 059 855 (Fujitsu Ltd.).

Primary Examiner—Patrick J. Ryan
Assistant Examiner—Kam F. Lee
Attorney, Agent, or Firm—Burns, Doane, Swecker & Mathis

[57] ABSTRACT

A multilayer interconnection substrate having, e.g., first to third power interconnections provided with first to third interconnection layers. A first insulating layer is provided between the first and second interconnection layers, and a second insulating layer is provided between the second and third interconnection layers. A plurality of first via holes are provided at said first insulating layer and connect the first and second power interconnections and a plurality of second via holes are provided at said second insulating layer with their position being shifted from that of the first via holes and connect the second and third power interconnection.

18 Claims, 7 Drawing Sheets

MULTILAYER INTERCONNECTION SUBSTRATE

BACKGROUND OF THE INVENTION

1. Field of the Invention

This invention relates to a multilayer interconnection substrate for use in electronic equipment.

2. Disclosure of the Prior Art

In the prior multilayer interconnection substrate, the power interconnection of one layer is connected to the interconnection of another layer with an interconnection position being shifted by using a special circuit riding-on the other layer, as shown in FIG. 1.

As shown in FIG. 1, the first power interconnection 6 is provided with the first layer on the multilayer interconnection substrate, the second power interconnection 7 is provided with the second layer which is positioned on the first layer through the first insulating layer and the third power interconnection 2 is provided with the third layer which is positioned on the second layer through the second insulating layer. Via holes 1 which connect the first power interconnection 6 to the second power interconnection 7 are provided with the first insulating layer and via holes 3 which connect the second power interconnection 7 to the third power interconnection 2 are provided with the second insulating layer, the position of the via holes 1 being shifted from that of the via holes 3.

Also, FIG. 2 shows a partial sectional view of the prior multilayer interconnection substrate, in which there are used the power interconnections which are formed in such a manner that the via holes pass through the lower layer to the upper layer at the same position. As seen from FIG. 2, a reference number 20 indicates a ceramic or glass ceramic multilayer interconnection substrate, 24 is the first insulating layer, 25 is the second insulating layer, 26 is the first power interconnection, 27 is the second power interconnection and 22 is the third power interconnection. The first power interconnection 26, the second power interconnection 27 and the third power interconnection 22 are connected through the via holes each other.

In the prior multilayer interconnection substrate as shown in FIG. 1, with respect to the power interconnection, there are problems that area of the power interconnection is extended and thus the resulting distribution resistance causes a higher voltage drop, that a pattern density is lowered and that open circuits occur when via contact fails.

In addition, in the prior multilayer interconnection substrate as shown in FIG. 2, it is possible to solve the problem of the high voltage drop in the power interconnection but the via holes will become deeper. Therefore, there is problem that, in a resist process for forming the power interconnection, the resist largely remains in the via hole portion when the depth of the via hole portion is beyond 30 microns and thus all the resist cannot be removed resulting in a in the residual resist 38, as shown in FIG. 3. In FIG. 3, a reference number 30 is a ceramic or glass ceramic multilayer interconnection substrate, 34 is the first insulating layer, 35 is the second insulating layer, 33 is the third insulating layer, 36 is the first power interconnection, 37 is the second power interconnection, 32 is the third power interconnection and 31 is the resist.

Moreover, there is known a flatting method using a embedding process but there are defects that the number of steps in the process is increased and connecting resistance is raised.

SUMMARY OF THE INVENTION

This invention was originated in order to obviate the above defects.

It is an object of the invention to provide a multilayer interconnection substrate comprising the first to third power interconnections provided with the first to third interconnection layers. A first insulating layer is provided between the first and second interconnection layers, a second insulating layer is provided between the second and third interconnection layers. A plurality of first via holes are provided at the first insulating layer and connect the first and second power interconnections and a plurality of second via holes are provided at the second insulating layer with their position being shifted from that of the first via holes and connect the second and third power interconnections.

It is an another object of the invention to provide a multilayer interconnection substrate comprising the first to fourth power interconnections provided with the first to fourth interconnection layer. A first insulating layer is provided between the first and second interconnection layers, a second insulating layer provided between the second and third interconnection layers, a third insulating layer provided between the third and fourth interconnection layer. A plurality of first via holes are provided at the first insulating layer and connect the first and second power interconnections, a plurality of second via holes are provided at the second insulating layer with their position being shifted from that of the first via holes and connect the second and third power interconnections and a plurality of the third via holes are provided at the third insulating layer with their position being shifted from that of the first and second via holes and connect the third and fourth power interconnection.

BRIEF DESCRIPTION OF THE DRAWINGS

By way of example of the many features and advantages of the invention, illustrative embodiment in the multilayer interconnection substrate is described and shown in the accompanying drawings, in which.

DETAILED DESCRIPTION OF THE PREFERRED EMBODIMENT

According to this invention, in the multilayer interconnection substrate, a first interconnection layer is connected with the second interconnection layer through a plurality of the first via holes of the first insulating layer. A second power interconnection is connected with the third power interconnection of the third interconnection layer, which is formed on the second power interconnection of the second interconnection layer, through a plurality of the second via holes. The first via holes are positioned so as not to be lain upon the second via holes and the respective power interconnection of each layer is connected to the interconnection of another layer on the layer with the position being shifted from that of the other interconnection, whereby the distribution resistance can become about ⅓ that of the prior multilayer interconnection substrate wherein the area of the interconnection is extended and the distribution resistance becomes higher. In addition, it becomes possible to eliminate the remaining resist on the via hole portions, which is caused by forming the via holes at the same position from the lower layer to the upper layer and forming the power interconnection therein to result in the deeper via holes. Moreover, by providing a plurality of the via holes on one power interconnection, even if one via hole is poorly formed and connection is not properly made, the other via holes serve to avoid that the entire power interconnection becomes poor.

EXAMPLE

Next, this invention will be described with reference to the accompanying drawings.

Figure 1:
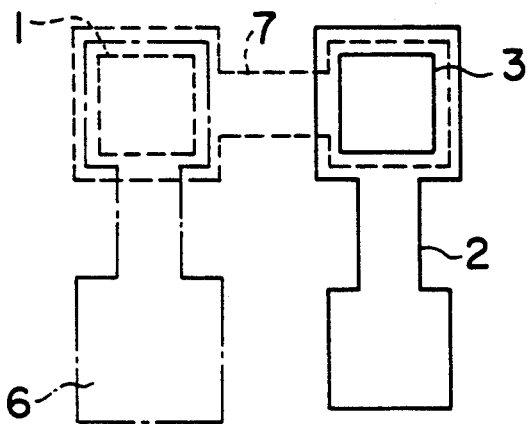
FIG. 1 shows a plan view of the prior multilayer interconnection substrate.
Figure 2:
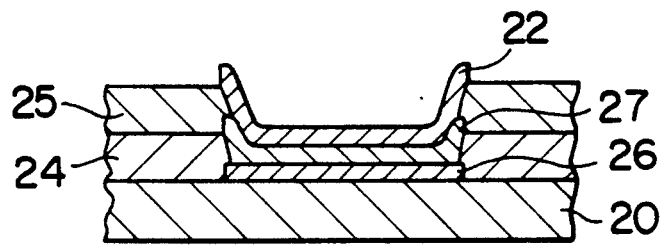
FIG. 2 shows a sectional view of the prior another multilayer interconnection substrate.
Figure 3:
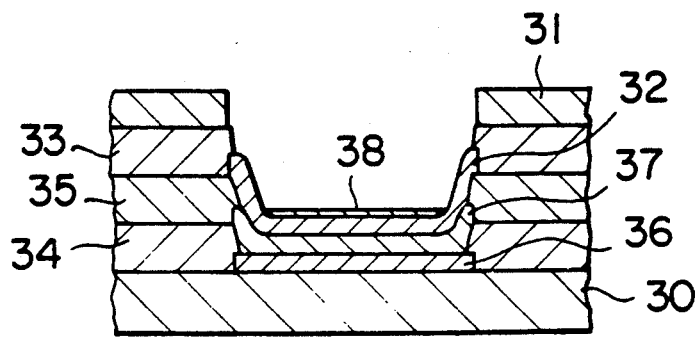
FIG. 3 shows a sectional view of the prior further another multilayer interconnection substrate.
Figure 4:
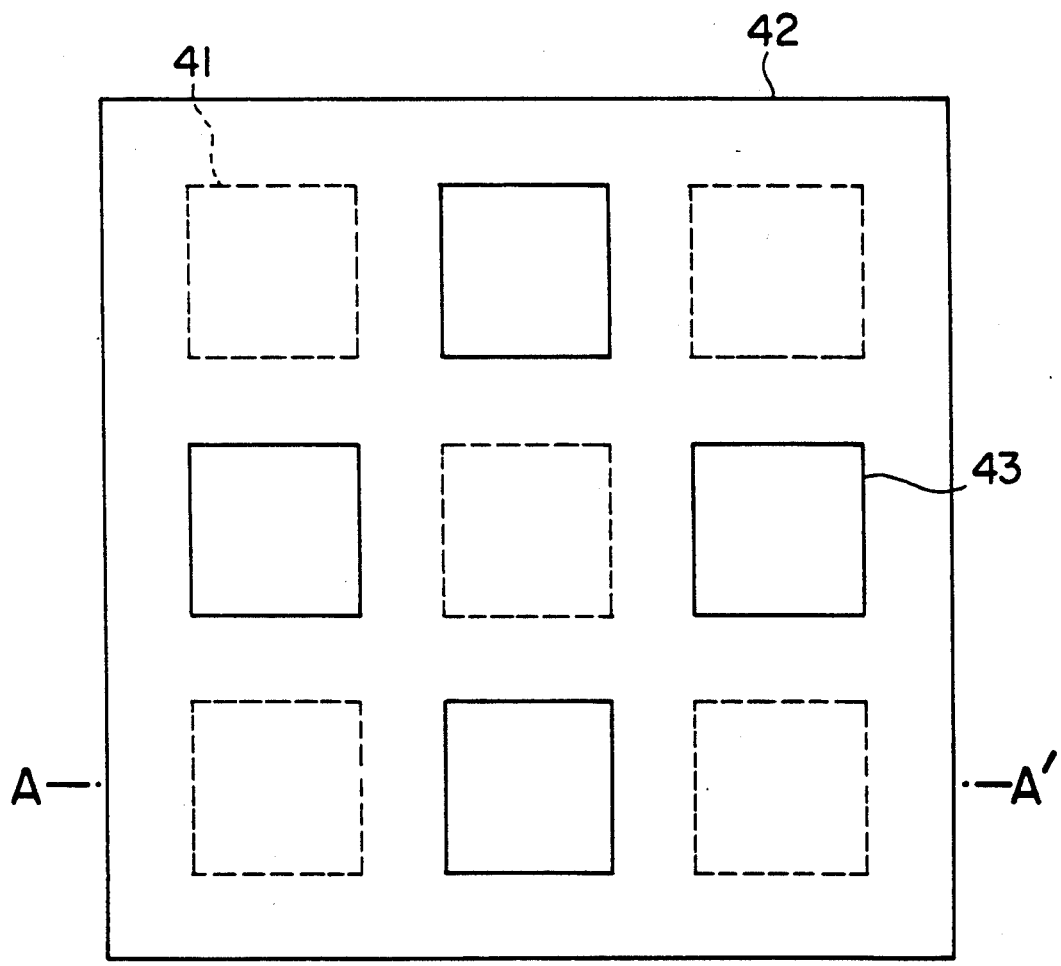
FIG. 4 shows a plan view of the first embodiment of this invention.

FIG. 4 shows a plan view of the first embodiment of this invention in which the position of the via holes are illustrated. In the drawing, the power interconnection of 250 square microns has four to five via holes of 50 microns square in each insulating layer.

In FIG. 4, via holes 41 in the first insulating layer, which is formed on the first power interconnection, are shown with broken lines. The second power interconnection is formed on the first insulating layer and via holes 43 in the second insulating layer are shown with solid lines. In this case, the via holes 41 in the first insulating layer are positioned so as not to be lain upon the via holes 43 in the second insulating layer. The third power interconnection 42 is formed on the second insulating layer.

Figure 5:
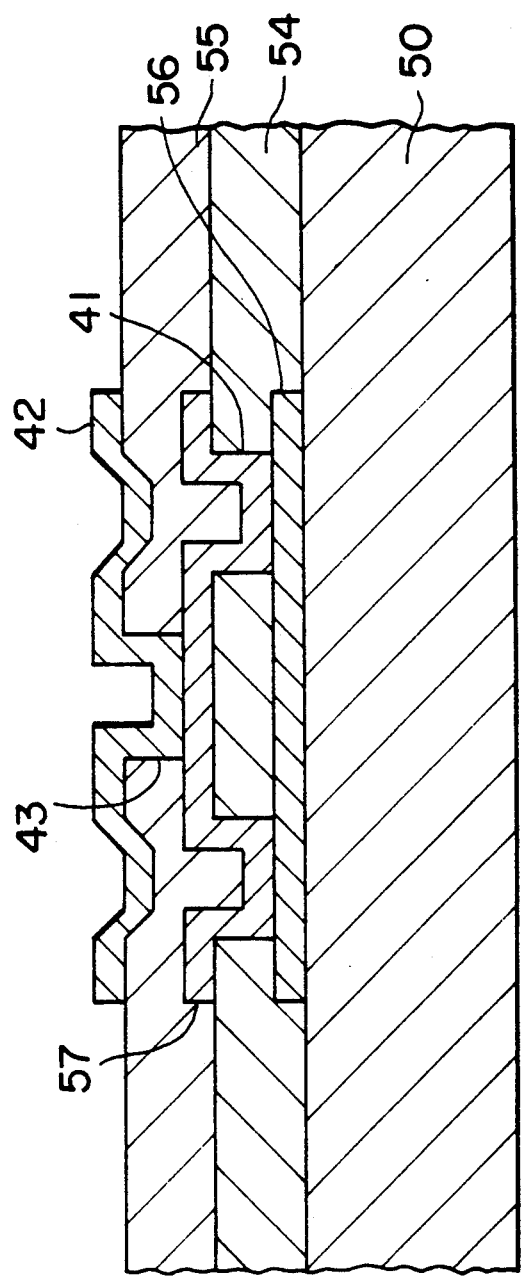
FIG. 5 shows a sectional view taken along the line A—A' of FIG. 4.

FIG. 5 shows a longitudinal section taken along the line A-A' of FIG. 4.

As seen from FIG. 5, the first power interconnection 56, which is composed of copper, gold or the like and has a thickness of 5 to 10 microns and a line width of 15 to 30 microns, is formed on a ceramic or glass ceramic multilayer interconnection substrate 50 by a plating method or the like and the first insulating layer 54 having five via holes 41 of 40 to 50 microns square, which is composed of an organic resin insulator and has a thickness of 15 to 25 microns, is formed on the substrate 50 with the first power interconnection 56 being formed thereon. The second power interconnection 57 is formed on the first insulating layer 54 by a plating method or the like in the same manner as mentioned above. The second insulating layer 55 having four via holes 43 of 40 to 50 microns square, which is composed of an organic resin insulator and has a thickness of 15 to 25 microns, is formed on the second power interconnection 57. Thereafter, the third power interconnection 42 is formed thereon according to the above process. In general, the above structure is repeated.

In the above case, the via holes on the power interconnection are positioned so that they are not lain upon the via holes of the lower layer, as shown in FIG. 4.

Figure 6:
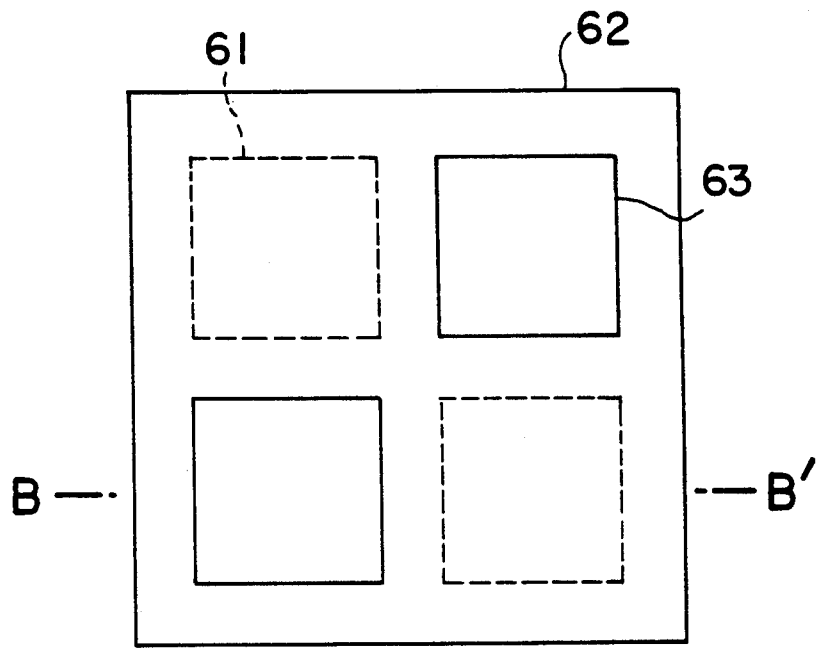
FIG. 6 shows a plan view of the second embodiment of this invention.

FIG. 6 shows a plan view of the second embodiment of this invention, in which the position of the via holes are shown. In FIG. 6, the power interconnection of 200 microns square has two via holes of 50 microns square in each insulating layer.

In FIG. 6, the via holes 61 of the first insulating layer, which is formed on the first power interconnection, are shown with broken lines. The second power interconnection is formed on the first insulating layer and the via holes 63 of the second insulating layer formed on the second power interconnection are shown with solid lines. In this case, the via holes 61 of the first insulating layer are positioned so that they are not lain upon the via holes 63 of the second insulating layer. The third power interconnection 62 is formed on the second insulating layer.

Figure 7:
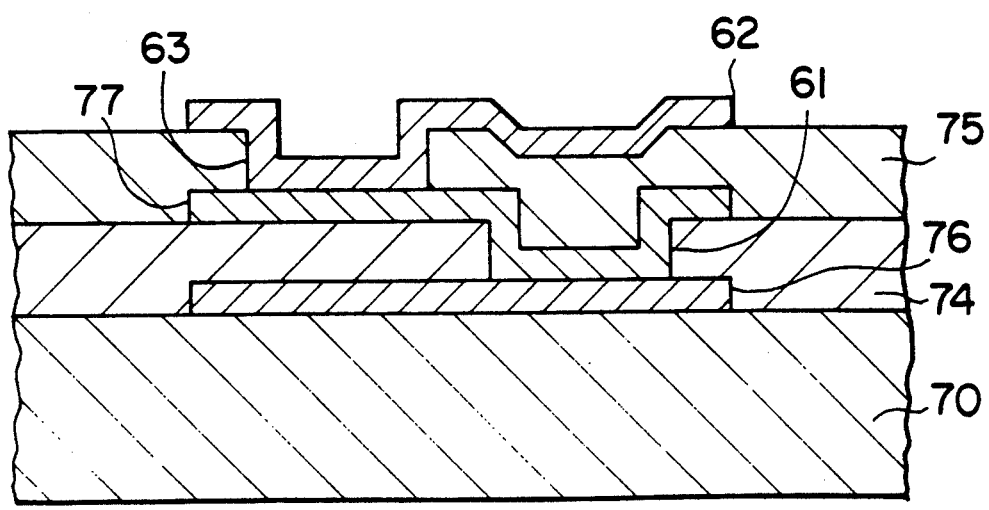
FIG. 7 shows a sectional view taken along the line B—B' of FIG. 6.

FIG. 7 shows a longitudinal section taken along the line B-B' of FIG. 6. In FIG. 7, a reference number 70 is a ceramic or glass ceramic multilayer interconnection substrate, 74 is the first insulating layer, 75 is the second insulating layer, 76 is the first power interconnection and 77 is the second power interconnection.

Figure 8:
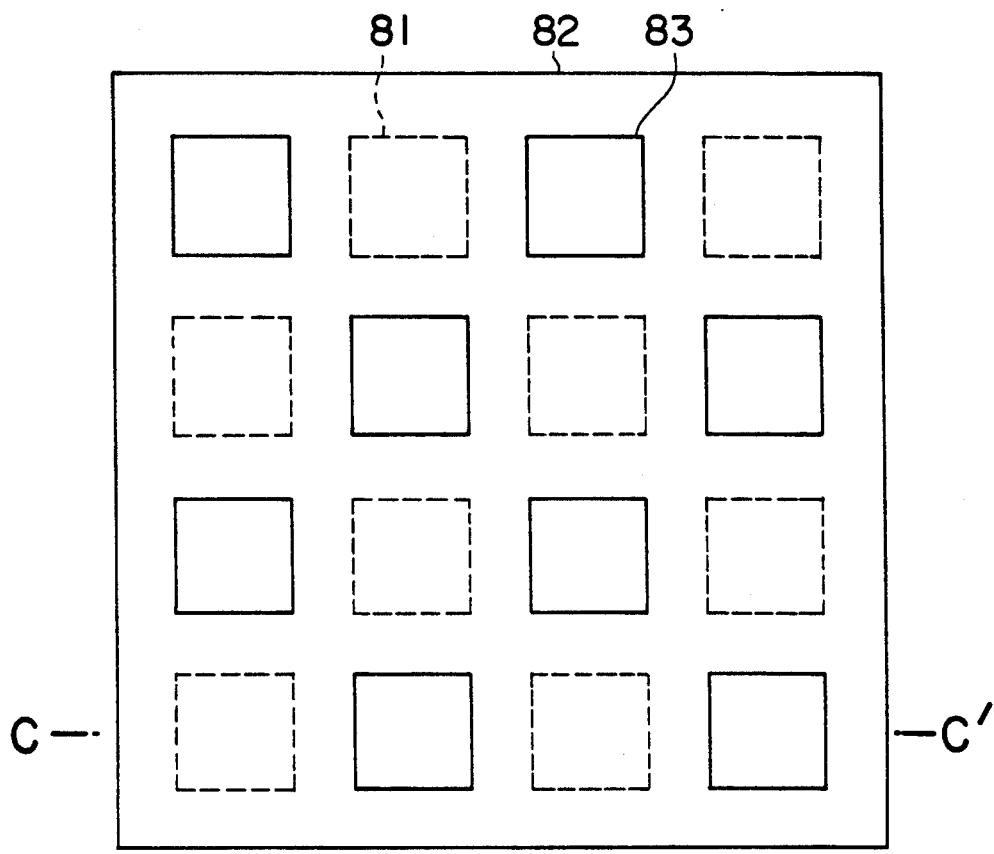
FIG. 8 shows a plan view of the third embodiment of this invention.

FIG. 8 shows a plan view of the third embodiment of this invention, in which the position of the via holes is shown. In FIG. 8, the power interconnection of 300 microns square has the eight via holes of 50 microns square in each insulating layer.

In FIG. 8, the via holes 81 of the first insulating layer, which is formed on the first power interconnection, are shown with broken lines. The second power interconnection is formed thereon, and the via holes 83 of the second insulating layer, which is formed on the second power interconnection, are shown with solid lines. In this case, the via holes 81 of the first insulating layer are positioned so that they are not lain upon the via holes 83 of the second insulating layer. The third power interconnection 82 is formed on the second insulating layer.

Figure 9:
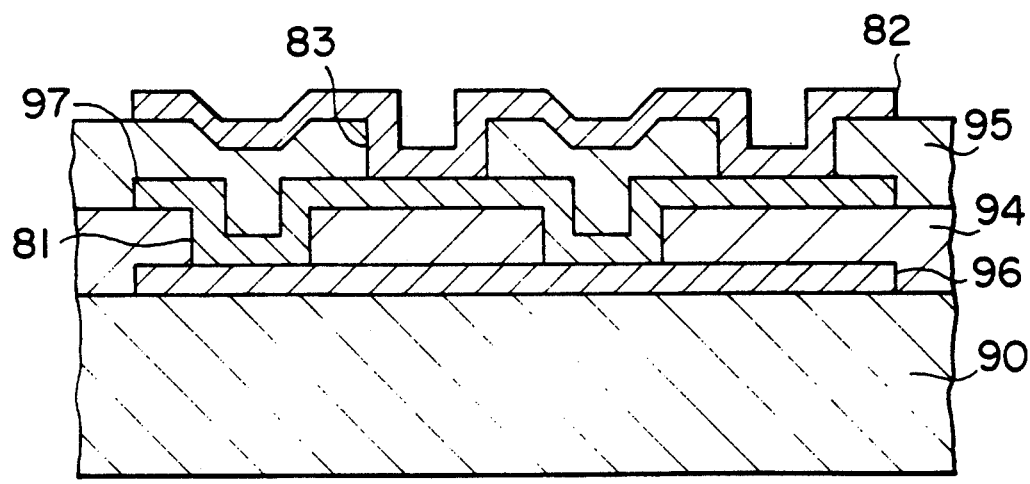
FIG. 9 shows a sectional view taken along the line C—C' of FIG. 8.

FIG. 9 shows a longitudinal section taken along the line C-C' of FIG. 8. In FIG. 9, a reference number 90 is a ceramic or glass ceramic multilayer interconnection substrate, 94 is the first insulating layer, 95 is the second insulating layer, 96 is the first power interconnection and 97 is the second power interconnection.

Figure 10:
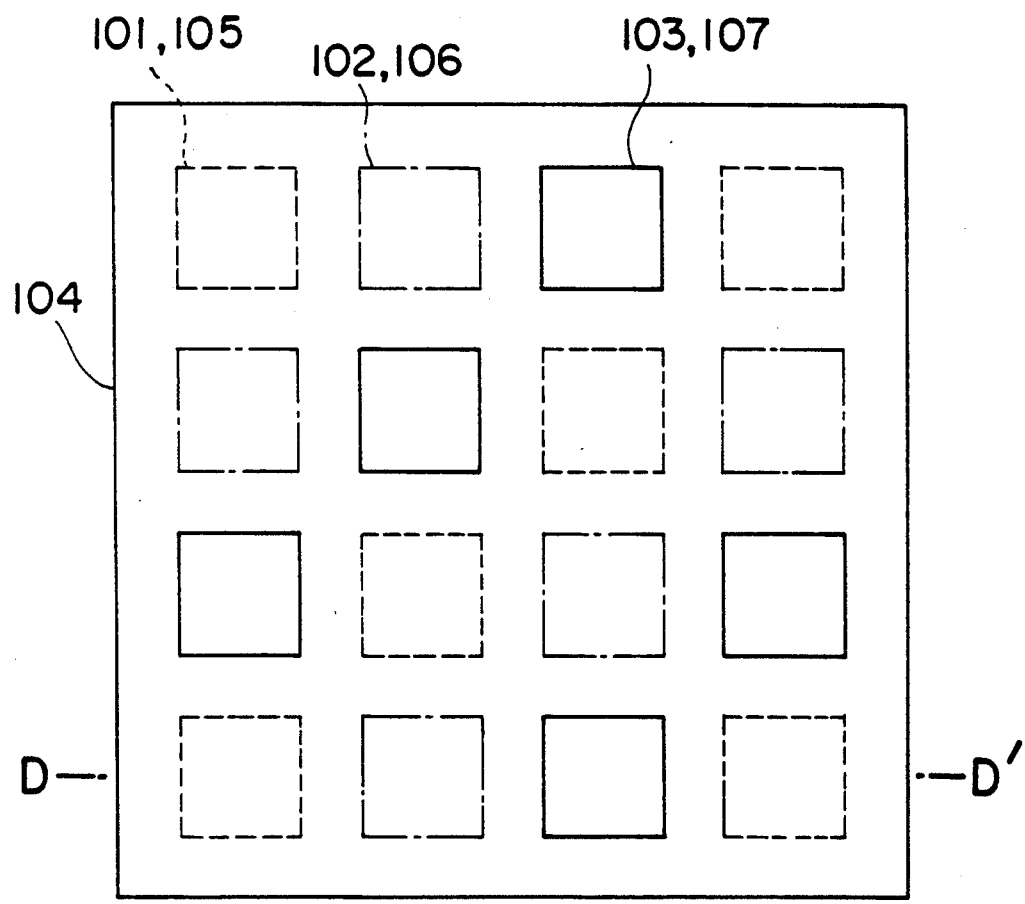
FIG. 10 shows a plan view of the fourth embodiment of this invention.

FIG. 10 shows a plan view of the fourth embodiment of this invention, in which the position of the via holes is shown. In FIG. 10, the power interconnection of 300 microns square has the five to six via holes of 50 microns square in each insulating layer.

In FIG. 10, the via holes 101 of the first insulating layer, which is formed on the first power interconnection, and the via holes 105 of the fourth insulating layer, which is formed on the fourth power interconnection, are shown with dotted lines (the via holes 101 were lain upon the via holes 105). The via holes 102 of the second insulating layer, which is formed on the second power interconnection, and the via holes 106 of the fifth insulating layer, which is formed on the fifth power interconnection, are shown with dot-dash-lines. The via holes 103 of the third insulating layer, which is formed on the third power interconnection, and the via holes 107 of the sixth insulating layer, which is formed on the sixth power interconnection, are shown with solid lines. In this case, the first insulating layer and the fourth insulating layer have the six via holes 101 and 105, respectively, and the second, third, fifth and sixth insulating layers have the five via holes 102, 103, 106 and 107, respectively.

Figure 11:
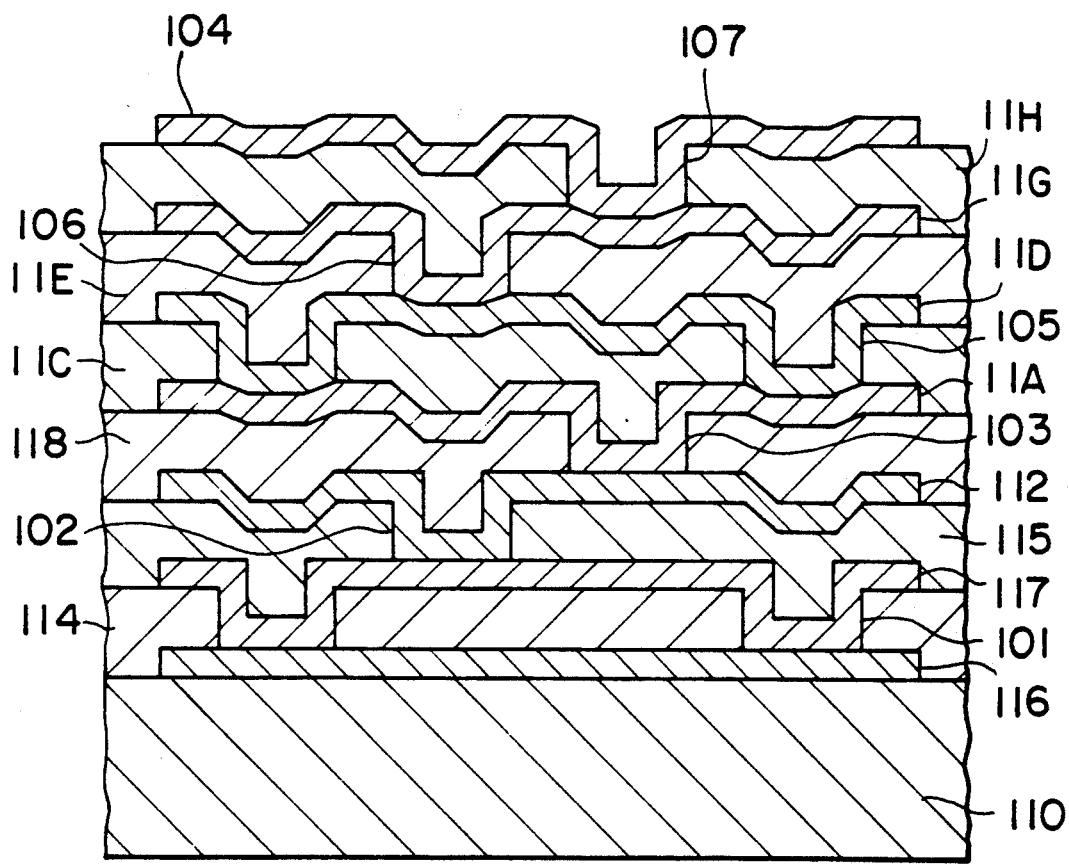
FIG. 11 shows a sectional view taken along the line D—D' of FIG. 10.

FIG. 11 shows a longitudinal section taken along the line D-D' of FIG. 10. In FIG. 11, a reference number 110 is a ceramic or glass ceramic multilayer interconnection substrate, 114 is the first insulating layer, 115 is the second insulating layer, 116 is the first power interconnection, 117 is the second power interconnection, 118 is the third insulating layer, 11A is the fourth power interconnection, 11C is the fourth insulating layer, 11D is the fifth power interconnection, 11E is the fifth insulating layer, 11G is the sixth power interconnection and 11H is the sixth insulating layer.

As seen from FIG. 11, the via holes 101 of the first insulating layer 114 are lain upon the via holes 105 of the fourth insulating layer 11C but the two insulating layers and the three power interconnections are interposed between these via holes, i.e., between the first and fourth insulating layers and thus the via hole portion does not become deeper. The other via hole portions are in the same manner as mentioned above.

What is claimed is:

1. A multilayer interconnection substrate comprising:
   first to third power interconnections provided with first to third interconnection layers;
   a first insulating layer made of organic resin and provided between said first and second interconnection layers;
   a second insulating layer made of organic resin and provided between said second and third interconnection layers;
   a plurality of first via holes which are provided at said first insulating layer and are each provided therein with said second interconnection layer to connect said first and second power interconnections and;
   a plurality of second via holes which are provided at said second insulating layer with the position of said second via holes being shifted from that of said first via holes and are each provided therein with said third interconnection layer to connect said second and third power interconnections;
   said first, second and third interconnection layers being provided in a positional relationship in which said power interconnection layers are superposed on one another through the insulating layers.

2. A multilayer interconnection substrate comprising:
   first to fourth power interconnections provided with first to fourth interconnection layers;
   a first insulating layer made of organic resin and provided between said first and second interconnection layers;
   a second insulating layer made of organic resin and provided between said second and third interconnection layers;
   a third insulating layer made of organic resin and provided between said third and fourth interconnection layers; and
   a plurality of first via holes which are provided at said first insulating layer and are each provided therein with said second interconnection layer to connect said first and second power interconnections, a plurality of second via holes which are provided at said second insulating layer with the position of said second via holes being shifted from that of said first via holes and are each provided therein with said third interconnection layer to connect said second and third power interconnections and a plurality of third via holes which are provided at said third insulating layer with the position being shifted from that of said first and second via holes and are each provided therein with said fourth interconnection layer to connect said third and fourth power interconnection;
   said first, second, third and fourth interconnection layers being provided in a positional relationship in which said power interconnection layers are superposed on one another through the insulating layers.

3. A multilayer interconnection substrate comprising:
   a first interconnection layer;
   a first insulating layer formed on said first interconnection layer and provided with a plurality of first via holes;
   a second interconnection layer formed on said first insulating layer and in said plurality of said first via holes, collectively constituting a first interconnection;
   a second insulating layer formed on said second interconnection layer and provided with a plurality of second via holes; and
   a third interconnection layer formed on said second insulating layer and in said plurality of said second via holes, collectively constituting a second interconnection;
   said first, second, third and fourth interconnection layers being provided in a positional relationship in which said power interconnection layers are superposed on one another through the insulating layers;
   said first via holes and second via holes being off-set to one another in plan view;
   said first interconnection layer and said second interconnection layer being electrically connected to each other in said first via holes; and
   said second interconnection layer and said third interconnection layer being electrically connected to each other in said second via holes.

4. A multilayer interconnection substrate according to claim 3, further comprising:
   a third insulating layer formed on said third interconnection layer and provided with a plurality of third via holes; and
   a fourth interconnection layer formed on said third insulating layer and said plurality of said third via holes, collectively constituting a third interconnection;
   said third and fourth interconnection layers being provided in a positional relationship in which said interconnection layers are superposed on one another through the third insulating layer;
   said second via holes and said third via holes being off-set to one another in plan view; and
   said third interconnection layer and said fourth interconnection layer being electrically connected to each other in said third via holes.

5. A multilayer interconnection substrate according to claim 4, further comprising:
   a fourth insulating layer formed on said fourth interconnection layer and provided with a plurality of fourth via holes; and
   a fifth interconnection layer formed on said fourth insulating layer and in said plurality of said fourth via holes, collectively constituting a fourth interconnection;

said fourth and fifth interconnection layers being provided in a positional relationship in which said interconnection layers are superposed on one another through the fourth insulating layer;

said third via holes and said fourth via holes being off-set to one another in plan view; and said fourth interconnection layer and said fifth interconnection layer being electrically connected to each other in said fourth via holes.

6. A multilayer interconnection substrate according to claim 5, further comprising:

a fifth insulating layer formed on said fifth interconnection layer and provided with a plurality of fifth via holes; and a sixth interconnection layer formed on said fifth insulating layer and in said plurality of said fifth via holes, collectively constituting a sixth interconnection;

said fifth and sixth interconnection layers being provided in a positional relationship in which said interconnection layers are superposed on one another through the fifth insulating layer;

said fourth via holes and said fifth via holes being off-set to one another in plan view; and said fifth interconnection layer and said sixth interconnection layer being electrically connected to each other in said fourth via holes.

7. A multilayer interconnection substrate comprising:
first to third interconnection layers;

a first insulating layer made of organic resin and provided between said first and second interconnection layers;

a second insulating layer made of organic resin and provided between said second and third interconnection layers;

a first power interconnection provided in said first interconnection layer;

a second power interconnection provided in said second interconnection layer;

third power interconnection provided in said third interconnection layer;

a plurality of first via holes provided in said first insulating layer, said plurality of first via holes electrically connecting said first power interconnection and said second power interconnection; and a plurality of second via holes provided in said second insulating layer, said plurality of second via holes electrically connecting said second power interconnection and said third power interconnection; wherein a width of each of said plurality of first via holes is less than one half of that of said first power interinterconnection;

a width of each of said plurality of second via holes is less than one half of that of said second power interconnection;

positions of said plurality of second via holes is shifted from those of said plurality of first via holes in plan view; and a distance between each of said plurality of first via holes and each of said plurality of second via holes is shorter than the width of said second power interconnection in a vertical direction.

8. A multilayer interconnection substrate comprising:
first to fourth interconnection layers;

a first insulating layer made of organic resin and provided between said first and second interconnection layers;

a second insulating layer made of organic resin and provided between said second and third interconnection layers;

a third insulating layer made of organic resin and provided between said third and fourth interconnection layers;

a first power interconnection provided in said first interconnection layer;

a second power interconnection provided in said second interconnection layer;

a third power interconnection provided in said third interconnection layer;

a fourth power interconnection provided in said fourth interconnection layer;

a plurality of first via holes provided in said first insulating layer, said plurality of first via holes electrically connecting said first power interconnection and said second power interconnection;

a plurality of second via holes provided in said second insulating layer, said plurality of second via holes electrically connecting said second power interconnection and said third power interconnection, and positions of said plurality of second via holes being shifted from those of said plurality of first via holes in plan view; and a plurality of third via holes provided in said third insulating layer, said plurality of third via holes electrically connecting said third power interconnection and said fourth power interconnection, and positions of said plurality of third via holes being shifted from those of said plurality of first via holes and said plurality of second via holes; wherein a width of each of said plurality of first via holes is less than one half of that of said first power interconnection;

a width of each of said plurality of second via holes is less than one half of that of said second power interconnection;

a width of each of said plurality of third via holes is less than one half of that of said third power interconnection; and a distance between each of said plurality of first via holes and each of said plurality of second via holes in shorter than the width of said second power interconnection in a vertical direction.

9. A multilayer interconnection substrate comprising:
first interconnection layer;

a first insulating layer formed on said first interconnection layer and provided with a plurality of first via holes;

a second interconnection layer formed on said first insulating layer and in said plurality of first via holes, collectively constituting a first electric interconnection;

a second insulating layer formed on said second interconnection layer and provided with a plurality of second via holes; and a third interconnection layer formed on said second insulating layer and in said plurality of second via holes, collectively constituting a second electric interconnection;

said first, second and third interconnection layers being provided in a positional relationship in which said first, second and third interconnection layers are superposed on one another through each of said insulating layers;

said first via holes and said second via holes being off-set to one another in plan view;

said first interconnection layer and said second interconnection layer being electrically connected to each other in said first via holes; and said second interconnection layer and said third interconnection layer being electrically connected to each other in said second via holes.

10. A multilayer interconnection substrate according to claim 9, further comprising:

a third insulating layer formed on said third interconnection layer and provided with a plurality of third via holes; and a fourth interconnection layer formed on said third insulating layer and in said plurality of third via holes, collectively constituting a third electric interconnection;

said third and fourth interconnection layers being provided in a positional relationship in which said third and fourth interconnection layers are superposed on one another through said third insulating layer;

said first via holes and said third via holes being off-set to one another in plan view and said second via holes and said third via holes being off-set to one another in plan view; and said third interconnection layer and said fourth interconnection layer being electrically connected to each other in said third via holes.

11. A multilayer interconnection substrate according to claim 10, further comprising:

a fourth insulating layer formed on said fourth interconnection layer and provided with a plurality of fourth via holes; and a fifth interconnection layer formed on said fourth insulating layer and in said plurality of fourth via holes, collectively constituting a fourth electric interconnection;

said fourth and fifth interconnection layers being provided in a positional relationship in which said fourth and fifth interconnection layers are superposed on one another through said fourth insulating layer;

said second via holes and said fourth via holes being off-set to one another in plan view and said third via holes and said fourth via holes being off-set to one another in plan view; and said fourth interconnection layer and said fifth interconnection layer being electrically connected to each other in said fourth via holes.

12. A multilayer interconnection substrate according to claim 11, further comprising:

a fifth insulating layer formed on said fifth interconnection layer and provided with a plurality of fifth via holes; and a sixth interconnection layer formed on said fifth insulating layer and in said plurality of fifth via holes, collectively constituting a fifth electric interconnection;

said fifth and sixth interconnection layers being provided in a positional relationship in which said fifth and sixth interconnection layers are superposed on one another through said fifth insulating layer;

said third via holes and said fifth via holes being off-set to one another in plan view and said fourth via holes and said fifth via holes being off-set to one another in plan view; and said fifth interconnection layer and said sixth interconnection layer being electrically connected to each other in said fourth via holes.

13. The multilayer interconnection substrate as defined in claim 7, wherein each of said first to third power interconnections has a size of 200 to 300 $\mu m$ square.

14. The multilayer interconnection substrate as defined in claim 8, wherein each of said first to fourth power interconnections has a size of 200 to 300 $\mu m$ square.

15. The multilayer interconnection substrate as defined in claim 9, wherein each of said first to third power interconnections has a size of 200 to 300 $\mu m$ square.

16. The multilayer interconnection substrate as defined in claim 10, wherein each of said first to fourth power interconnections has a size of 200 to 300 $\mu m$ square.

17. The multilayer interconnection substrate as defined in claim 11, wherein each of said first to fifth power interconnections has a size of 200 to 300 $\mu m$ square.

18. The multilayer interconnection substrate an defined in claim 12, wherein each of said first to sixth power interconnections has a size of 200 to 300 $\mu m$ square.

* * * * *